(12) United States Patent
Ogawa

(10) Patent No.: US 8,658,888 B2
(45) Date of Patent: *Feb. 25, 2014

(54) SOLAR ENERGY UTILIZATION DEVICE AND METHOD FOR MANUFACTURING THE SAME

(75) Inventor: Kazufumi Ogawa, Awa (JP)

(73) Assignee: Empire Technology Development LLC, Wilmington, DE (US)

( * ) Notice: Subject to any disclaimer, the term of this patent is extended or adjusted under 35 U.S.C. 154(b) by 597 days.

This patent is subject to a terminal disclaimer.

(21) Appl. No.: 12/665,298

(22) PCT Filed: Dec. 12, 2007

(86) PCT No.: PCT/JP2007/074469
§ 371 (c)(1),
(2), (4) Date: Dec. 17, 2009

(87) PCT Pub. No.: WO2009/075040
PCT Pub. Date: Jun. 18, 2009

(65) Prior Publication Data
US 2010/0212736 A1    Aug. 26, 2010

(51) Int. Cl.
*H01L 31/00* (2006.01)
(52) U.S. Cl.
USPC .......... 136/261; 136/256; 423/342; 423/347; 438/69; 349/137; 257/E31.119
(58) Field of Classification Search
USPC ............. 136/261, 256; 423/342, 347; 438/69; 349/137; 257/E31.119
See application file for complete search history.

(56) References Cited

U.S. PATENT DOCUMENTS

| | | | |
|---|---|---|---|
| 4,210,687 A * | 7/1980 | Obendorf et al. | 428/34.7 |
| 4,467,068 A | 8/1984 | Maruyama et al. | |
| 5,266,358 A | 11/1993 | Uemura et al. | |
| 5,324,566 A | 6/1994 | Ogawa et al. | |
| 5,437,894 A * | 8/1995 | Ogawa et al. | 427/535 |

(Continued)

FOREIGN PATENT DOCUMENTS

| | | | |
|---|---|---|---|
| JP | 01-126244 | 5/1989 | |
| JP | 04132637 | * 9/1990 | C03C 17/30 |

(Continued)

OTHER PUBLICATIONS

Epoxy siloxane catalog: 2005.*

(Continued)

*Primary Examiner* — Shane Fang
(74) *Attorney, Agent, or Firm* — Foley & Lardner LLP

(57) ABSTRACT

A solar energy utilization device wherein the surface of the incident light side of the transparent base material 1 is covered by water-and-oil-shedding transparent fine particles 5 being bound and fixed to the surface. A method for manufacturing a solar energy utilization device comprising process A of manufacturing reactive transparent fine particles 9 with the first functional group at one end; process B of manufacturing reactive transparent base material 4 with the second functional group at one end forming a covalent bond with the first functional group; process C of manufacturing transparent base material 10 by reacting the reactive transparent fine particles 9 with the reactive transparent base material 4 for binding and fixing the reactive transparent fine particles 9 to the surface; and process D of forming water-and-oil-shedding coating 16 on the surface of the transparent fine particles 5 being bound and fixed to the surface of the transparent base material 10.

16 Claims, 5 Drawing Sheets

(56) References Cited

U.S. PATENT DOCUMENTS

| | | |
|---|---|---|
| 2005/0206790 A1 | 9/2005 | Chao |
| 2006/0154048 A1 | 7/2006 | Teranishi et al. |
| 2006/0216476 A1 | 9/2006 | Ganti et al. |
| 2006/0263516 A1* | 11/2006 | Jones et al. ............ 427/180 |
| 2009/0046379 A1* | 2/2009 | Kuramoto et al. ........ 359/718 |
| 2009/0068453 A1 | 3/2009 | Chung |
| 2010/0119774 A1 | 5/2010 | Ogawa |
| 2011/0232330 A1 | 9/2011 | Noni, Jr. |

FOREIGN PATENT DOCUMENTS

| | | |
|---|---|---|
| JP | 04-132637 | 5/1992 |
| JP | 04-239633 | 8/1992 |
| JP | 06-340451 | 12/1994 |
| JP | 07-090691 | 4/1995 |
| JP | 7-300346 A | 11/1995 |
| JP | 2001-180981 | 7/2001 |
| JP | 2003-145042 | 5/2003 |
| JP | 2005-169761 A | 6/2005 |
| JP | 2005-206790 | 8/2005 |
| JP | 2006-224234 | 8/2006 |
| JP | 2007-126332 A | 5/2007 |
| JP | 2007-333291 | 12/2007 |
| JP | 2008-007363 | 1/2008 |
| JP | 2008-007365 | 1/2008 |
| WO | WO-2004/052640 | 6/2004 |
| WO | WO-2008/120783 | 10/2008 |

OTHER PUBLICATIONS

International Search Report and Written Opinion issued in PCT/JP2007/074469, mailed Apr. 8, 2008.

"Blueprint to repel oil and water," *Science News*, Dec. 6, 2008, vol. 174, No. 12, 2 pp., downloaded Jan. 8, 2013 from http://www.sciencenews.org/view/generic/id/38466/description/Blueprint_to_repel_oil_water.pdf.

International Search Report for Intl. Pat. Appln. No. PCT/JP2007/059788, dated Aug. 21, 2007, 1 p.

International Search Report for Intl. Pat. Appln. No. PCT/JP2008/056373, dated May 13, 2008, 3 pp.

Sung, L-P., et al., "Scratch behavior of nano-alumina/polyurethane coatings," Journal of Coatings Technology and Research, vol. 5, No. 4, pp. 419-430 (2008).

Wikipedia, "Self-assembled monolayer," accessed on May 18, 2013 at http://en.wikipedia.org/wiki/Self_assembled_monolayer, pp. 1-11.

Yeo, L., "Wetting and Spreading," in *Encyclopedia of Microfluidics and Nanofluidics*, 2008, Editor D. Li, Springer, New York, pp. 2186-2196.

* cited by examiner

Where  represents

Where  represents $$\begin{array}{c} O- \\ | \\ H_2NCH_2O(CH_2)_3Si-O- \\ | \\ O- \end{array}$$

Where ⊖ represents the bond of

Where  represents $$CF_3(CF_2)_7(CH_2)_2Si\begin{matrix}NH-\\|\\-NH-\\|\\NH-\end{matrix}$$

and  represents bond of $-Si-NH-$

SOLAR ENERGY UTILIZATION DEVICE AND METHOD FOR MANUFACTURING THE SAME

BACKGROUND OF THE INVENTION

1. Field of the Invention

The present invention is related to a solar energy utilization device, such as a solar cell, a solar water heater, or a glasshouse, and the method for manufacturing the same, wherein the device has durability, high water-repellency (water-sliding property), and an effect of reducing a surface reflection of incident light, including water-and-oil-shedding transparent fine particles formed on an incident light side of a surface of a transparent base material.

2. Description of Related Art

Generally, it is well known that the power generation efficiency of solar cells that are installed outside and the heat collection efficiency of solar water heaters or glasshouses deteriorate over time due to the build-up of dirt from rain and dust in the air.

It is also well known that a chemical adsorption liquid including a fluorocarbon chlorosilane-based adsorption agent and non-aqueous organic solvent can be used to form a water-and-oil-shedding antifouling chemical adsorption monomolecular film in a monomolecular film form by chemically adsorbing in a liquid phase (for example, see Japanese Patent Application Laid Open No. 4-132637).

The principle requirement for manufacturing a monomolecular film in such a solution is to use a de-hydrochloric acid reaction between active hydrogen, such as a hydroxyl group on the surface of the base material and a chlorosilyl group in a chlorosilane-based adsorption agent, to form a monomolecular film.

SUMMARY OF THE INVENTION

Since conventional monomolecular films use the chemical bond between the adsorption agent and the surface of the base material, they have a certain wear resistance and water-and-oil-shedding antifouling properties; however, there was a sufficiency problem that the weather resistance, water-repellency, and antifouling properties were not sufficient for an antifouling coating of solar cells and solar water heaters. In addition, since the coating was extremely thin, we could not expect a substantial reducing effect on the surface reflection of the incident light.

Regarding a solar energy utilization device, such as solar cells and solar water heaters that require high durability, high water-repellency, and water-and-oil-shedding antifouling properties, the present invention aims toward providing a solar energy utilization device and the method for manufacturing the same, which will improve the power generation efficiency of solar cells and the heat collection efficiency of solar water heaters or glasshouses and which can prevent deterioration over time by dirt by improving wear resistance, high water-repellency, and antifouling properties, as well as the effect of reducing the surface reflection of the incident light.

In order to solve the above-described problems, the first aspect of this invention, which is presented, is a solar energy utilization device, wherein the surface of the incident light side of the transparent base material is covered by water-and-oil-shedding transparent fine particles that are bound and fixed to the foregoing surface.

The second aspect of this invention is the solar energy utilization device of the first aspect of this invention, wherein the foregoing transparent fine particles are covered by a water-and-oil-shedding coating.

The third aspect of this invention is the solar energy utilization device of the second aspect of this invention, wherein the foregoing water-and-oil-shedding coating is covalently bound to the surface of the foregoing transparent fine particles.

The fourth aspect of this invention is the solar energy utilization device of the second or the third aspect of this invention, wherein the foregoing water-and-oil-shedding coating comprises the $CF_3$ group.

The fifth aspect of this invention is the solar energy utilization device of the second through fourth aspects of this invention, inclusive, wherein a part of the surface of the foregoing transparent fine particles is bound to a first film compound, which has a first functional group at one end and is bound to the surface of the foregoing transparent fine particles at the other end; a part of the surface of the foregoing transparent base material is bound to a second film compound, which has a second functional group reacted with the foregoing first functional group to form a covalent bond at one end and is bound to the surface of the foregoing transparent base material at the other end; and the foregoing transparent fine particles are bound and fixed to the surface of the foregoing transparent base material by a covalent bond formed by a reaction between the foregoing first functional group and the second functional group.

The sixth aspect of this invention is the solar energy utilization device of the fifth aspect of this invention, wherein the foregoing first and second film compounds are covalently bound to the respective surface of the foregoing transparent fine particles and the foregoing transparent base material via Si.

The seventh aspect of this invention is the solar energy utilization device of the fifth or sixth aspect of this invention, wherein one or more of the compounds chosen from the foregoing water-and-oil-shedding coating, the foregoing first film compound, and the foregoing second film compound form a monomolecular film.

The eighth aspect of this invention is the solar energy utilization device of the fifth through seventh aspects of this invention, inclusive, wherein either the foregoing first or the second functional group is an epoxy group, and the other is an amino group or an imino group.

The ninth aspect of this invention is the solar energy utilization device of the first through fourth aspects of this invention, inclusive, wherein the foregoing transparent fine particles are bound and fixed to the surface of the foregoing transparent base material by sintering.

The tenth aspect of this invention is the solar energy utilization device of the ninth aspect of this invention, wherein the foregoing transparent fine particles cover the surface of the foregoing transparent base material with a single layer.

The eleventh aspect of this invention is the solar energy utilization device of the first through tenth aspects of this invention, inclusive, wherein the foregoing transparent fine particles comprise a substance selected from translucent silica, alumina, or zirconia.

The twelfth aspect of this invention is the solar energy utilization device of the first through eleventh aspects of this invention, inclusive, wherein the size of the foregoing transparent fine particles is 100 nm or less.

The thirteenth aspect of this invention is a method for manufacturing a solar energy utilization device comprising: process A of having transparent fine particles react with a first film compound, which has a first functional group at one end and has a first binding group forming a bond by a reaction with the surface group of the foregoing transparent fine particles at the other end to manufacture reactive transparent fine particles in which the foregoing first film compound is bound to the surface via the foregoing first binding group; process B of having the transparent base material of the solar energy utilization device react with a second film compound, which has a second functional group forming a covalent bond by a reaction with the foregoing first functional group at one end and has a second binding group forming a bond by a reaction with the surface group of the foregoing transparent base material at the other end to manufacture a reactive transparent base material in which the foregoing second film compound is bound to the surface via the foregoing second binding group; process C of contacting the foregoing reactive transparent fine particles with the foregoing reactive transparent base material to react the foregoing first functional group with the foregoing second functional group in order to form a covalent bond to bind and fix the foregoing reactive transparent fine particles to the surface of the foregoing transparent base material; and process D of having the transparent fine particles bound and fixed to the surface of the foregoing transparent base material react with a water-and-oil-shedding compound comprising a third binding group covalently bound to the surface of the foregoing transparent fine particles by a reaction at the one end to form a water-and-oil-shedding coating on the surface of the foregoing transparent fine particles.

The fourteenth aspect of this invention is the method for manufacturing a solar energy utilization device in the thirteenth aspect of this invention, wherein redundant chemical adsorption liquid is cleaned and removed after one or more processes chosen from the foregoing processes A through D, inclusive.

The fifteenth aspect of this invention is the method for manufacturing a solar energy utilization device in the thirteenth or fourteenth aspect of this invention, wherein the foregoing third binding group is trichlorosilane, and the foregoing process D performs the reaction between the foregoing water-and-oil-shedding compound and the foregoing transparent fine particles under the presence of a silanol condensation catalyst.

The sixteenth aspect of this invention is the method for manufacturing a solar energy utilization device in the fifteenth aspect of this invention, wherein at least one promoter chosen from a ketimine compound, organic acid, aldimine compound, enamine compound, oxazolidine compound, or an aminoalkylalkoxysilane compound is used with the foregoing silanol condensation catalyst.

The seventeenth aspect of this invention is the method for manufacturing a solar energy utilization device in the thirteenth through sixteenth aspects of this invention, inclusive, wherein the foregoing transparent base material is glass and which follows the foregoing process C by further providing the process E of sintering the transparent base material, to which the foregoing transparent fine particles are bound and fixed, in an atmosphere containing oxygen wherein organic matters are then thoroughly removed so that the foregoing transparent fine particles are directly fixed to the foregoing transparent base material.

The eighteenth aspect of this invention is the method for manufacturing a solar energy utilization device in the seventeenth aspect of this invention, wherein the temperature of the foregoing sintering is equal to or higher than 400 degrees Celsius and lower than the melting temperature of the foregoing transparent base material and the foregoing transparent fine particles.

Since the surface of the incident light side of the transparent base material is covered by water-and-oil-shedding transparent fine particles that are bound and fixed to its surface, the weather resistance and antifouling property of the transparent base material can be improved.

In addition, if transparent fine particles covered by a water-and-oil-shedding coating are used as the foregoing water-and-oil-shedding transparent fine particles, it advantageously enables the easy manufacture of water-and-oil-shedding transparent fine particles with cheap raw material with excellent wear resistance, such as silica and alumina.

If the foregoing water-and-oil-shedding coating is covalently bound to the surface of the transparent fine particles, it is advantageous for improving its rain resistance (weather resistance), even though the transparent base material is made of glass, since the water-and-oil-shedding coating does not directly contact the transparent base material.

If the foregoing water-and-oil-shedding coating comprises the $CF_3$ group, it is advantageous for giving a water-and-oil-shedding antifouling function.

If the foregoing transparent fine particles are covalently bound and fixed to the surface of the incident light side of the foregoing transparent base material by the covalent bond formed by a reaction between the foregoing first functional group and the second functional group, it is advantageous for simultaneously improving durability, the antifouling property, and water-repellency.

If the foregoing first and second film compounds are covalently bound to the respective surface of the foregoing transparent fine particles and the foregoing transparent base material via Si, it can advantageously further improve the weather resistance of the surface of the foregoing transparent base material.

If one or more of the compounds chosen from the foregoing water-and-oil-shedding coating, the foregoing first film compound, and the foregoing second film compound form a monomolecular film, it advantageously prevents the impairment of light transmission.

If either the foregoing first or second functional group is an epoxy group, and the other is an amino group or an imino group, the covalent bond formed by these reactions is stable and also excellent in terms of mechanical strength and weather resistance, as well as not producing any volatile components; thus, during the reaction, it is not causing problems, including contraction associated with the reaction. Therefore, it advantageously further improves the weather resistance and optical property of the surface of the transparent base material.

In addition, if the foregoing water-and-oil-shedding transparent fine particles are directly sintered and fixed to the surface of the foregoing transparent base material by sintering, it is advantageous for further improving the durability.

If the transparent fine particles directly fixed to the surface of the transparent base material by the foregoing sintering cover the surface of the foregoing transparent base material with a single layer, it is advantageous for improving the availability of the incident light, since the scattering of the incident light can be suppressed.

If the foregoing transparent fine particles are made of translucent silica, alumina, or zirconia, it is advantageous for improving water resistance and wear resistance.

If the size of the foregoing transparent fine particles is 100 nm or less, it advantageously prevents the impairment of the light transmission for the available light.

The present invention provides a method for manufacturing a solar energy utilization device that allows the easy manufacture of a solar energy utilization device with improved wear resistance, water-repellency, antifouling property, and availability of incident light at low cost through processes comprising: process A of having transparent fine particles react with a first film compound, which has a first functional group at one end and has a first binding group forming a bond by a reaction with the surface group of the foregoing transparent fine particles at the other end to manufacture reactive transparent fine particles in which the foregoing first film compound is bound to the surface via the foregoing first binding group; process B of having the transparent base material of the solar energy utilization device react with a second film compound, which has a second functional group forming a covalent bond by a reaction with the foregoing first functional group at one end and has a second binding group forming a bond by a reaction with the surface group of the foregoing transparent base material at the other end to manufacture a reactive transparent base material in which the foregoing second film compound is bound to the surface via the foregoing second binding group; process C of contacting the foregoing reactive transparent fine particles with the foregoing reactive transparent base material to react the foregoing first functional group with the foregoing second functional group in order to form a covalent bond to bind and fix the foregoing reactive transparent fine particles to the surface of the foregoing transparent base material; and process D of having the transparent fine particles bound and fixed to the surface of the foregoing transparent base material react with a water-and-oil-shedding compound comprising a third binding group covalently bound to the surface of the foregoing transparent fine particles by a reaction at the one end to form a water-and-oil-shedding coating on the surface of the foregoing transparent fine particles.

If redundant chemical adsorption liquid is cleaned and removed after one or more processes chosen from the foregoing processes A through D, inclusive, the amount of organic matters mediating between the foregoing transparent base material and the foregoing transparent fine particles can be minimized so that it is advantageous for improving the weather resistance, as well as for removing organic matters by sintering.

If the foregoing third binding group is trichlorosilane and the foregoing process D performs the reaction between the foregoing water-and-oil-shedding compound and the foregoing transparent fine particles under the presence of a silanol condensation catalyst, it advantageously improves the mechanical strength of the foregoing water-and-oil-shedding coating, as well as allowing the reaction to perform in a short period of time.

If at least one promoter chosen from a ketimine compound, organic acid, aldimine compound, enamine compound, oxazolidine compound, or an aminoalkylalkoxysilane compound is used with the foregoing silanol condensation catalyst, it advantageously allows the manufacturing time of the foregoing water-and-oil-shedding coating to be reduced.

After the process of binding and fixing the foregoing reactive transparent fine particles to the surface of the foregoing transparent base material via the covalent bond formed between the film compounds, if performing a sintering process in an atmosphere containing oxygen to thoroughly remove organic matters in order to directly fix the transparent fine particles to the transparent base material, it is further advantageous for improving the weather resistance and wear resistance.

If the temperature of the sintering is equal to or higher than 400 degrees Celsius and lower than the melting temperature of the transparent base material and the transparent fine particles, it advantageously further improves the weather resistance and wear resistance.

As described above, regarding a solar energy utilization device, such as solar cells and solar water heaters that require high durability, high water-repellency, and water-and-oil-shedding antifouling properties, the present invention has the effect of improving the power generation efficiency of solar cells and the heat collection efficiency of solar water heaters, as well as preventing deterioration over time by dirt, at the same time, by reducing the surface reflection of the incident light and improving the wear resistance, high water-repellency, and antifouling property; thus, providing solar cells that can maintain power generation efficiency for a long period of time and solar water heaters that can maintain heat collection efficiency for a long period of time.

BRIEF DESCRIPTION OF THE DRAWINGS

FIG. 1 is a conceptual diagram of Example 1 of the present invention, which expands to the molecular level in order to explain the process of forming a monomolecular film containing epoxy groups on the surface of the transparent base material.

FIG. 2 is a conceptual diagram of Example 1 of the present invention, which expands to the molecular level in order to explain the process of forming a monomolecular film containing amino groups on the surface of the fine alumina particle.

FIG. 3 is a conceptual diagram of Example 1 of the present invention, which expands to the molecular level in order to explain the process of binding the fine alumina particles to the surface of the transparent base material.

DETAILED DESCRIPTION

Figure 1A:
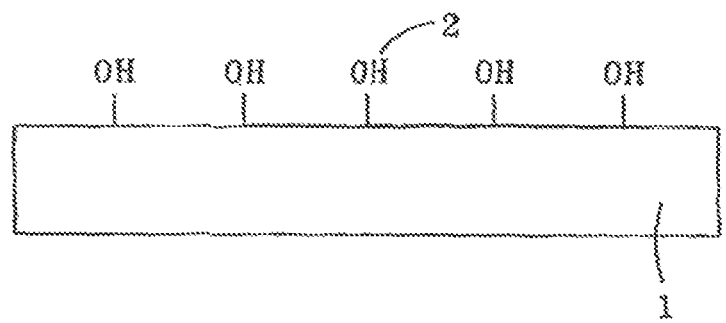
FIG. 1A illustrates the surface of the transparent base material before the reaction.

In more concrete terms, the gist of the present invention provides a solar energy utilization device, wherein the surface of the incident light side of the transparent base material is covered by water-and-oil-shedding transparent fine particles that are bound and fixed to the surface through a manufacturing method comprising: the process [process A] of having transparent fine particles that are made of translucent silica, alumina, or zirconia contact a first chemical adsorption liquid, including a first film compound, which has a first functional group, such as an epoxy group, amino group, imino group, isocyanate group, or hydroxyl group, at one end and which has a first binding group, such as a trialkoxysilyl group, at the other end, silanol condensation catalyst, and non-aqueous organic solvent, in order to manufacture reactive transparent fine particles with the first functional group by a reaction for binding between the surface group of the transparent fine particles and the first binding group; the process [process B] of having the surface of the incident light side of the transparent base material used for the solar energy utilization device, such as solar cells and solar water heaters, contact a second chemical adsorption liquid, including a second film compound, which has a second functional group forming a covalent bond by a reaction with the foregoing first functional group at one end (e.g., if the first functional group is an epoxy group, this may be an amino group or an imino group, or if the first functional group is an isocyanate group, this may be an amino group or a hydroxyl group) and has a second binding group, such as a trialkoxysilyl group, at the other end, silanol condensation catalyst, and non-aqueous organic solvent, in order to manufacture a reactive transparent base material with the second functional group by a reaction for binding between the surface group of the transparent base material and the second binding group; the process [process C] of contacting the reactive transparent fine particles with the reactive transparent base material to react the first functional group with the second functional group by heating in order to form a covalent bond to bind and fix the foregoing reactive transparent fine particles to the surface of the foregoing transparent base material; and the process [process D] of having the surface of the transparent base material, wherein the transparent fine particles are bound and fixed to the foregoing surface, contact a third chemical adsorption liquid, including a water-and-oil-shedding compound that has a third binding group, such as a trichlorosilyl group or a trialkoxysilyl group at one end and that has a water-and-oil-shedding group, such as a fluorocarbon group at the other end, silanol condensation catalyst, and non-aqueous organic solvent, in order for covalently binding the third binding group to the surface of the transparent fine particles to form a water-and-oil-shedding coating on the surface of the foregoing transparent fine particles.

Therefore, regarding solar cells and solar water heaters that require high durability, high water-repellency, and water-and-oil-shedding antifouling properties, the present invention works to provide solar cells and solar water heaters, which can improve the power generation efficiency and heat collection efficiency of the mechanisms and which can prevent deterioration over time by dirt by improving wear resistance, high water-repellency, and antifouling properties, as well as the effect of reducing the surface reflection of the incident light.

Although examples are hereinafter used to describe the details of the present invention, these examples shall not be construed as limiting of the present invention.

Regarding a solar energy utilization device according to the present invention, such as solar cells and solar water heaters, the method for improving the power generation efficiency and heat collection efficiency and the method for providing the function to prevent deterioration over time by dirt by improving wear resistance, high water-repellency, and antifouling properties, as well as the effect of reducing the surface reflection of the incident light, have the same principles; therefore, as a representative example, glass shall be used for the incident light side of the transparent base material of the solar cells for an explanation hereinafter.

EXAMPLES

Example 1

First, as the incident light side of the transparent base material of solar cells, a glass-made transparent base material 1 was prepared, cleaned, and dried thoroughly. Next, the second film compound containing the reactive second functional group (e.g., epoxy group) at the functional site and an alkoxysilyl group (as an example of the second binding group) at the other end (for example, the film compound shown in the following chemical formula [Formula C1]) was measured at 99 w/t %, and as a silanol condensation catalyst (for example, dibutyltin diacetylacetonate), was measured at 1 w/t %, respectively, and these were dissolved into a silicone solvent (e.g., hexamethyldisiloxane solvent) to prepare a chemical adsorption liquid so that it had a total concentration of about 1 w/t % (preferably, the concentration of the film compound is between approximately 0.5% to 3%).

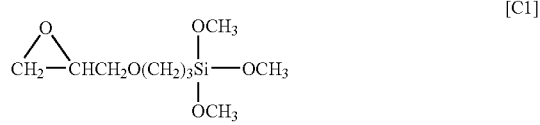

[C1]

This adsorption liquid was applied to the surface of the foregoing transparent base material 1 and reacted in a normal atmosphere (45% relative humidity) for approximately two hours. In this case, since the surface of the foregoing glass-made transparent base material 1 contains many hydroxyl groups (surface groups) 2 (shown in FIG. 1A), a monomolecular film 3 containing epoxy groups, which forms a chemical bond with the surface of the transparent base material throughout the surface, was formed at a thickness of about 1 nm due to the bonding formation shown in the following formula [Formula C2] by a dealcoholization reaction (in this case, de-$CH_3OH$) between the $Si(OCH_3)$ group of the foregoing film compound and the foregoing hydroxyl groups 2 under the presence of the silanol condensation catalyst. (In the case that the transparent base material is made of acrylic resin or polycarbonate resin, if the surface is preprocessed for hydrophilicity by a corona treatment, plasma treatment, or by an oxidizing agent, a coating was formed in a similar way)

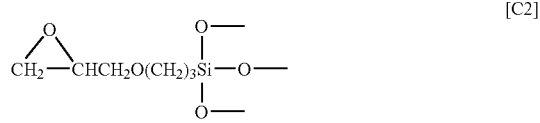

[C2]

Figure 1B:
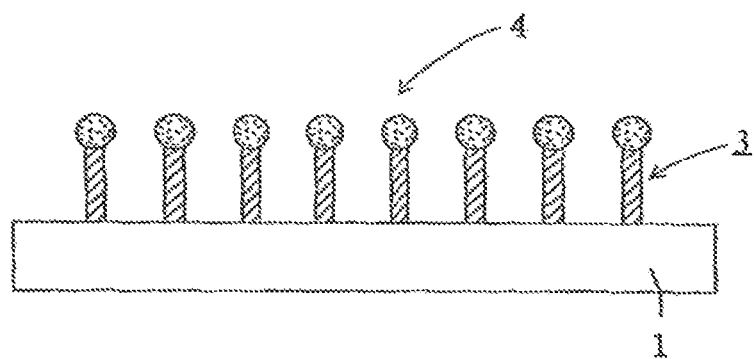
FIG. 1B illustrates the surface after a monomolecular film containing epoxy groups is formed.
Figure 1B:
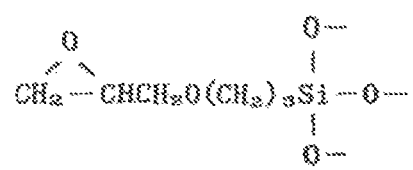

Then, the coating was cleaned with a chlorinated solvent, such as chloroform, so that a transparent base material (reactive transparent base material) 4 covered over the surface by a monomolecular film 3, which has a reactive epoxy group at the surface, could be manufactured (FIG. 1B).

When it was taken out into the atmosphere and was left without cleaning, the solvent evaporated and the film compound left behind on the surface of the transparent base material reacted with the moisture in the atmosphere at the surface of the transparent base material, and an extremely thin polymer coating was formed from the foregoing film compound on the surface of the fine particles. This coating has almost the same reactivity. In particular, when it was sintered in an atmosphere containing oxygen necessary for removing organic matters, there were no problems at all.

On the other hand, fine alumina particles 5 (an example of the transparent fine particles) with an average particle diameter of about 100 nm (preferably, less than 100 nm) were prepared and dried thoroughly. Next, the first film compound containing an amino (—NH$_2$) group or an imino (=NH) group (as an example of the first functional group that reacts with the epoxy group at the functional site and an alkoxysilyl group as an example of the first binding group) at the other end (for example, the film compound containing an amino group at the terminal position shown in the following chemical formula [Formula C3]) was measured at 99 w/t %, and an acetic acid as an organic solvent instead of a silanol condensation catalyst, was measured at 1 w/t %, respectively, and these were dissolved into a solvent that was a mixture of the same quantity of silicone and dimethylformamide (e.g., a liquid solution with 50% hexamethyldisiloxane and 50% dimethylformamide) to prepare a chemical adsorption liquid so that it had a total concentration of about 1 w/t % (preferably, the concentration of the film compound is between approximately 0.5% to 3%).

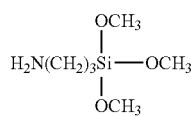

[C3]

Figure 2A:
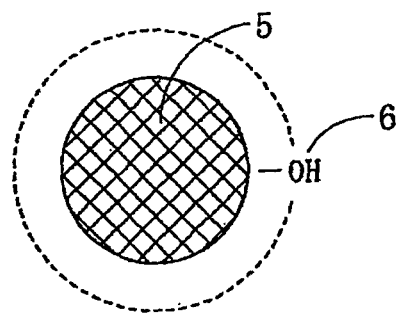
FIG. 2A illustrates the surface of the fine alumina particle before the reaction.

The foregoing anhydrous fine alumina particles 5 were mixed and stirred in this adsorption liquid and reacted in a normal atmosphere (45% relative humidity) for approximately two hours. In this case, since the surface of the fine alumina particles 5 contains many hydroxyl groups (surface groups) 6 (shown in FIG. 2A), a monomolecular film 8 containing amino groups 7, which form a chemical bond with the surface of the fine particles throughout the surface, was formed at a thickness of about 1 nm due to the bonding formation shown in the following formula [Formula C4] by a dealcoholization reaction (in this case, de-CH$_3$OH) between the Si(OCH$_3$) group of the first film compound and the foregoing hydroxyl groups under the presence of the acetic acid.

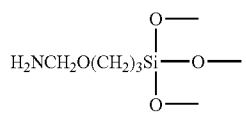

[C4]

Figure 2B:
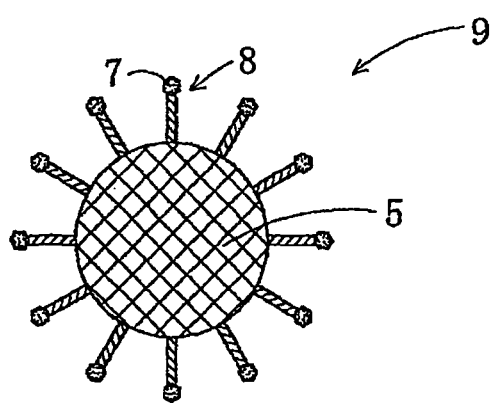
FIG. 2B illustrates the surface after a monomolecular film containing amino groups is formed.
Figure 2B:
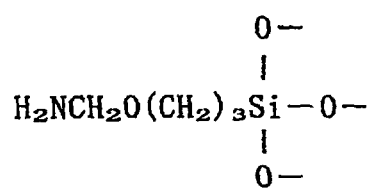

Then, the compound was stirred and cleaned with a chlorinated solvent, such as chloroform, so that fine alumina particles 9 (as an example of the reactive transparent fine particles) covered by a monomolecular film 8, which has amino groups 7 at the surface, could be formed (FIG. 2B).

Here, when using a film compound containing amino groups, it is preferable to use an organic acid, such as acetic acid, since the amino group reacts with the tintype catalyst to produce a deposition. Other than the amino group, substances containing imino groups, such as pyrrole derivatives and imidazole derivatives, could be used. Furthermore, after ketimine derivatives were used to form a monomolecular film, the amino group was easily introduced by hydrolysis of the ketimine residue.

Similar to the case of the reactive transparent base material 4, since the monomolecular film 8 formed by this process is extremely thin with a film thickness at the nanometer level, the particle diameter of the fine alumina particles was not impaired.

When it was taken out into the atmosphere without cleaning, the reactivity was almost the same; however, the solvent evaporated and the film compound left behind on the particle surface reacted at the particle surface with the moisture in the atmosphere, and fine alumina particles on which an extremely thin polymer coating was then formed from the foregoing chemical adsorption agent at the particle surface were obtained.

Next, the fine alumina particles 9 covered by the monomolecular film 8 containing the foregoing amino groups 7 were dispersed in an ethanol solution and applied to the surface of the transparent base material 4 covered by the monomolecular film 3 containing the foregoing epoxy group, then heated at 100 degrees Celsius for 30 minutes; thus, the epoxy groups and the amino groups were reacted and added to each other by the reaction shown in the following formula [Formula C5], binding and fixing the transparent base material 4 and the fine alumina particles 5 via the two monomolecular films.

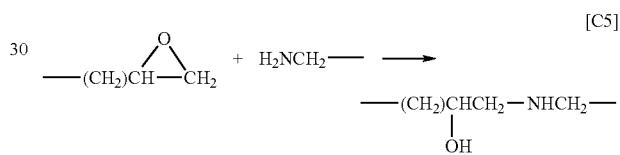

[C5]

Figure 3A:
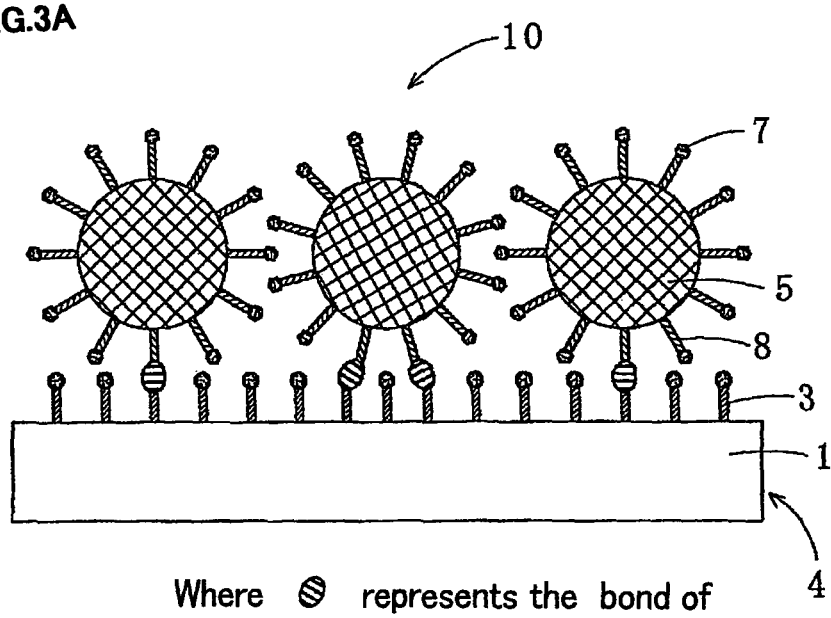
FIG. 3A illustrates the surface of the transparent base material to which the fine alumina particles are bound via two monomolecular films.
Figure 3A:
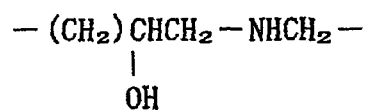

Then, the compound was further cleaned with an organic solvent, such as chloroform, so that redundant fine alumina particles covered by a monomolecular film containing unreacted amino groups were removed; thus, a transparent base material for solar cells 10, wherein the surface of the transparent base material 1 and the fine alumina particles 5 were covalently bound to each other only in one layer via the foregoing two monomolecular films 3 and 8, was obtained (FIG. 3A).

Figure 3B:
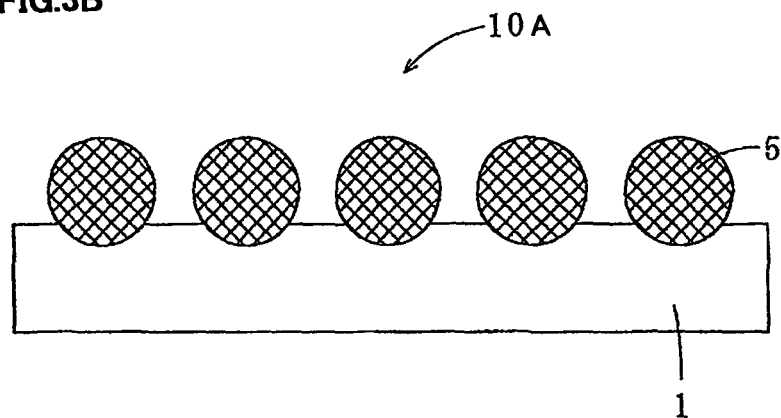
FIG. 3B illustrates the surface wherein after the sintering process the two monomolecular films are decomposed and removed, the fine alumina particles are bound and fixed directly to the surface of the transparent base material.

Here, in the later process of the solar cell manufacturing, when a high temperature processing with a temperature of 350 degrees Celsius or higher, which could cause a heat decomposition of the film compound, is required, if a sintering is performed for 30 minutes at 600 degrees Celsius, for example, in the atmosphere (depending on the softening temperature of the base material, the temperature is accordingly adjusted in the range from 400 degrees Celsius to lower than the melting temperature of the transparent base material and the transparent fine particles) in order to manufacture a transparent base material 10A, wherein the film compound (organic compound) is decomposed and removed thoroughly, and the fine alumina particles 5 are directly bound and fixed to the surface of the transparent base material 1 in one layer, it is preferable to avoid problems, such as tinting, to the base material by a heat decomposition of the film compound (FIG. 3B).

If performing a printing process that can be used at a temperature of 250 degrees Celsius or lower in the later process of the solar cell manufacturing process, this sintering process is not always necessary, and the transparent base material 10, wherein the surface of the transparent base material 1 and the fine alumina particles 5 are covalently bound to each other only in one layer via the foregoing monomolecular films 3 and 8, can be used (FIG. 3A).

Figure 4:
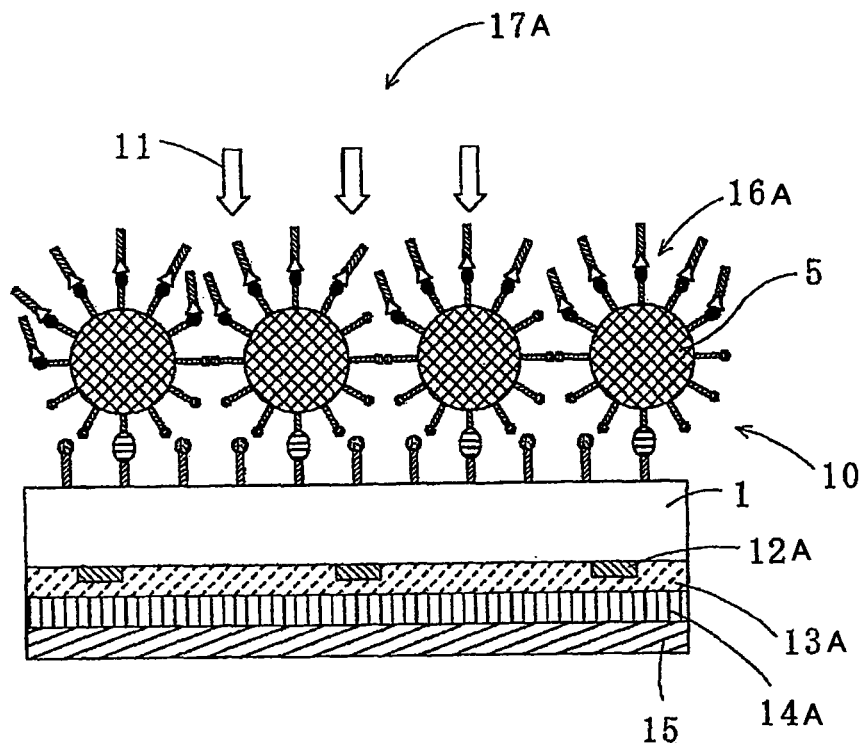
FIG. 4 is a conceptual section view of the solar cell produced in Example 1 of the present invention, which expands to the molecular level in order to explain how a water-shedding monomolecular film is formed throughout the surface of the incident light side, after the fine alumina particles were bound and fixed directly to the surface of the base material by sintering and further an amorphous solar cell layer was formed.
Figure 4:
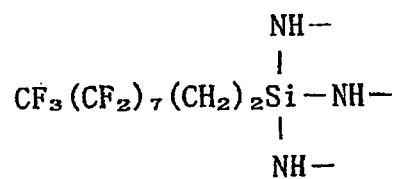
Figure 4:
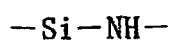

As shown in FIG. 4, ITO, which becomes a transparent electrode 12, was evaporated and formed into a film by the spatter evaporation method on the surface opposite to the incident light 11 side of this transparent base material 10A; and by using the plasma CVD method, an n-type amorphous silicon layer 13 and a p-type amorphous silicon layer 14 were sequentially formed by a publicly known method; and then, an aluminum-back electrode 15 serving also as a reflection coating was evaporated and formed on top of it, so that a solar cell layer was created. Here, since the film-forming temperature of the amorphous silicon and the evaporation temperature of the aluminum electrode is usually 450 degrees Celsius or lower, the solar cell manufacturing process did not damage the foregoing transparent base material 10A to which fine particles were bound and fixed.

Finally, when a water-and-oil-shedding compound containing a chlorosilyl group as an example of a fluorocarbon group and the third binding group with a water-and-oil-shedding property (e.g., $CF_3(CF_2)_7(CH_2)_2SiCl_3$) was dissolved into a non-aqueous solvent (e.g., anhydrous nonane) at a concentration of about 1 w/t % to prepare a chemical adsorption liquid (hereinafter referred to as "adsorption liquid"), and the adsorption liquid was applied to the incident light side of the surface of the transparent base material 10A for reaction in a dry atmosphere (preferably, the relative humidity of 30% or less), since the fine alumina particles 5 on the surface of the transparent base material 1 were covered by many hydroxyl groups (—OH), a de-hydrochloric acid reaction occurred between the chlorosilyl group (SiCl group), which is the foregoing water-and-oil-shedding compound and the hydroxyl group on the surface of the foregoing fine alumina particles 5, hence a bond was generated as shown in the following formula [Formula C6] throughout the entire surface of the fine alumina particles 5. Later, it was cleaned with a chlorofluorocarbon solvent, so that the surface was covered by a water-and-oil-shedding antifouling monomolecular film 16 (an example of water-and-oil-shedding coating); thus, a solar cell 17 with a nanoscopic roughness in the incident light side of the surface was manufactured (FIG. 4).

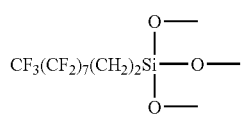
[C6]

Since the film thickness of this monomolecular film is only about 1 nm, the roughness of about 50 nm in the surface of the transparent base material formed with the fine alumina particles was hardly impaired. In addition, because of the effect of this roughness, the apparent droplet contact angle of the incident light side of the surface of the transparent base material of this solar cell 17 becomes about 160 degrees, achieving super-water-shedding and super-water-repellency properties.

When this water-and-oil-shedding compound was used to form a monomolecular film on the flat surface of the base material, the critical surface energy became 6 to 7 mN/m and the maximum droplet contact angle became about 115 degrees.

This means that the surface of the transparent base material produced by the method in accordance with the present invention achieved a surface with a significantly small surface energy (average 3 mN/m or less) and with an extremely high water-repellency and antifouling properties.

Furthermore, the fine alumina particles are bound and fixed to the surface of the transparent base material directly or via a covalent bond formed between film compounds, as well as being harder than glass and containing almost no alkaline components; therefore, higher wear resistance and water resistance were obtained, as well as significantly improving weather resistance compared to those of a monomolecular film produced by using $CF_3(CF_2)_7(CH_2)_2SiCl_3$ directly to the surface of the transparent glass base material.

In addition, since the obtained coating thickness, including fine particles, was about 100 nm in total, its transparency was not impaired.

Furthermore, since this water-and-oil-shedding transparent fine particle film is able to freely control the surface refractive index between 1.3 and 1.5 by controlling the deposit density of the nanoparticles, the surface reflection of the plane on the incident light side were minimized.

Example 2

Figure 5:
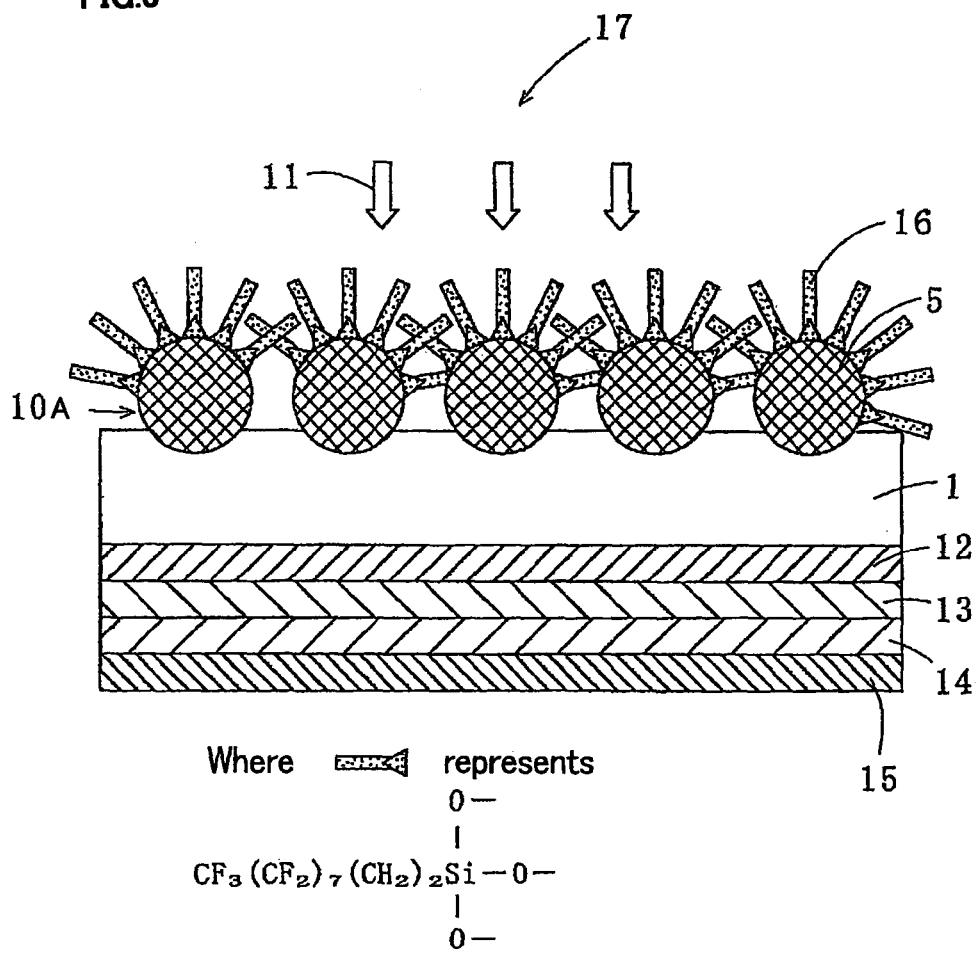
FIG. 5 is a conceptual section view of the solar cell produced in Example 2 of the present invention, which expands to the molecular level in order to explain how solar cell layers are formed by printing processes, after the fine alumina particles were bound and fixed to the surface of the transparent base material via the two monomolecular films and further the water-shedding monomolecular film was formed throughout the surface on the incident light side.

However, in Example 1, if the adsorption liquid containing $CF_3(CF_2)_7(CH_2)_2SiCl_3$ was applied to the surface of the transparent base material for reaction in the same manner, except for not performing a sintering process, since the fine alumina particles 5 on the surface of the transparent base material 4 covalently bound only in one layer via two monomolecular films were covered by many amino groups (surface groups) 7 (FIG. 3A), it causes a de-hydrochloric acid reaction between the chlorosilyl group (SiCl group) of the foregoing chemical adsorption agent and the amino group (—NH$_2$) of the foregoing alumina fine particles to generate a bond as shown in the following formula [Formula C7] throughout the surface. Later, it was cleaned with a chlorofluorocarbon solvent, so that the plane on the incident light side was covered by a water-and-oil-shedding antifouling monomolecular film 16A (an example of water-and-oil-shedding coating) comprising the foregoing water-and-oil-shedding compound; thus, a transparent base material with a nanoscopic surface roughness was manufactured. Then, a silver paste comb-shaped electrode 12A, n-type semiconductor layer 13A, and p-type semiconductor layer 14A, were sequentially formed at the back by a printing process, and further, an aluminum-back electrode 15, serving also as a reflection coating, was evaporated and formed on top of it in order to form a solar cell layer, so that a solar cell 17A with a nanoscopic surface roughness on the incident light side covered by a water-and-oil-shedding antifouling monomolecular film 16A was manufactured (FIG. 5).

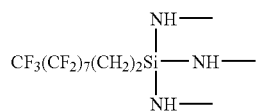
[C7]

In Examples 1 and 2, when the water-and-oil-shedding antifouling monomolecular film 16 or 16A was formed, if it was taken out into the atmosphere and left without cleaning, the solvent evaporated and the water-and-oil-shedding compound left behind on the surface of the transparent base material reacted with the moisture in the atmosphere on the surface, and a water-and-oil-shedding antifouling polymer coating with a film thickness of several tens nm was formed.

Since this coating maintained the surface roughness to some degree, the wear resistance, high water-repellency, and antifouling properties, as well as the effect of reducing the surface reflection, were hardly changed.

Example 3

In the same way as Examples 1 and 2, a transparent base material 10A, wherein the fine alumina particles were directly bound and fixed only in one layer to the surface of the transparent base material of the solar cell by sintering, or a transparent base material 10, wherein the fine alumina particles were bound and fixed only in one layer via a covalent bond formed between the film compounds, was manufactured. Then, after solar cell layers 12 through 15, or 12A through 15a were manufactured at the back, a water-and-oil-shedding compound containing a fluorocarbon group (—$CF_3$) at one end and an alkoxysilyl group at the other end (for example, the water-and-oil-shedding compound represented by $CF_3(CF_2)_7(CH_2)_2Si(OCH_3)_3$) was measured at 99 w/t %, and as a silanol condensation catalyst (for example, dibutyltin diacetylacetonate) was measured at 1 w/t %, respectively, and these were dissolved into a silicone solvent (e.g., hexamethyldisiloxane solvent) to prepare a chemical adsorption liquid so that it had a concentration of about 1 w/t % (preferably, the concentration of the water-and-oil-shedding compound is between approximately 0.5% to 3%). Then, after the solar cell, wherein the fine alumina particles were covalently bound only in one layer to the plane on the incident light side of the transparent base material, was immersed and reacted for approximately two hours and the redundant adsorption agent was cleaned and removed, the alkoxysilyl group undergoes a dealcoholization reaction with the amino group; thus, a solar cell with excellent water shedding, water-repellency, and light resistance properties, as well as a low surface reflection similar to Examples 1 and 2, was manufactured.

Example 4

Unlike Examples 1 and 2, a monomolecular film with amino groups in the surface of the transparent base material was manufactured while a monomolecular film with epoxy groups in the surface of the fine alumina particles was manufactured, and the fine alumina particles were bound and fixed in one layer to the surface of the transparent base material through a reaction shown in [Formula C5]. Then, following a sintering, or otherwise left just as is, if it was finally reacted with $CF_3(CF_2)_7(CH_2)_2SiCl_3$, a solar cell with excellent water shedding, water-repellency, and light resistance properties, as well as a low surface reflection at the same level as Examples 1 and 2, was manufactured.

Example 5

In addition, in the same way as Example 4, a monomolecular film with amino groups in the surface of the transparent base material was manufactured while a monomolecular film with epoxy groups in the surface of the fine alumina particles was manufactured, and the fine alumina particles were fixed in one layer to the surface of the transparent base material through the same reaction. Then, following a sintering, or otherwise left just as is, if it was finally reacted with $CF_3(CF_2)_7(CH_2)_2Si(OCH_3)_3$ in the same way as Example 3, a solar cell with excellent water shedding, water-repellency, and light resistance properties, as well as a low surface reflection at the same level as Examples 1 and 2, was manufactured.

Although the above Examples 1 and 5 used the substance shown in [Formula C1] or [Formula C3] as a film compound containing a reactive group, the following compounds (1) through (16), inclusive, other than those described above could also be used:

(1) $(CH_2OCH)CH_2O(CH_2)_7Si(OCH_3)_3$
(2) $(CH_2OCH)CH_2O(CH_2)_{11}Si(OCH_3)_3$
(3) $(CH_2CHOCH(CH_2)_2CH)(CH_2)_2Si(OCH_3)_3$
(4) $(CH_2CHOCH(CH_2)_2CH)(CH_2)_4Si(OCH_3)_3$
(5) $(CH_2CHOCH(CH_2)_2CH)(CH_2)_6Si(OCH_3)_3$
(6) $(CH_2OCH)CH_2O(CH_2)_7Si(OC_2H_5)_3$
(7) $(CH_2OCH)CH_2O(CH_2)_{11}Si(OC_2H_5)_3$
(8) $(CH_2CHOCH(CH_2)_2CH)(CH_2)_2Si(OC_2H_5)_3$
(9) $(CH_2CHOCH(CH_2)_2CH)(CH_2)_4Si(OC_2H_5)_3$
(10) $(CH_2CHOCH(CH_2)_2CH)(CH_2)_6Si(OC_2H_5)_3$
(11) $H_2N(CH_2)_5Si(OCH_3)_3$
(12) $H_2N(CH_2)_7Si(OCH_3)_3$
(13) $H_2N(CH_2)_9Si(OCH_3)_3$
(14) $H_2N(CH_2)_5Si(OC_2H_5)_3$
(15) $H_2N(CH_2)_7Si(OC_2H_5)_3$
(16) $H_2N(CH_2)_9Si(OC_2H_5)_3$

Hereinabove, the ($CH_2OCH$) group represents a functional group shown in the following formula [Formula C8], and the ($CH_2CHOCH(CH_2)_2CH$) group represents a functional group shown in the following formula [Formula C9].

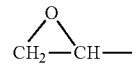

[C8]

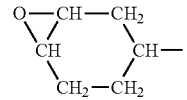

[C9]

Although the above Examples 1, 2, and 4 used $CF_3(CF_2)_7(CH_2)_2SiCl_3$ as a fluorocarbon water-and-oil-shedding compound for the formation of the water-and-oil-shedding layer in the plane on the incident light side, the following trichlorosilane compounds (21) through (26), inclusive (including the hydrocarbon type), other than those described above, could also be used.

(21) $CF_3CH_2O(CH_2)_{15}SiCl_3$
(22) $CF_3(CH_2)_3Si(CH_3)_2(CH_2)_{15}SiCl_3$
(23) $CF_3(CF_2)_5(CH_2)_2Si(CH_3)_2(CH_2)_9SiCl_3$
(24) $CF_3(CF_2)_7(CH_2)_2Si(CH_3)_2(CH_2)_9SiCl_3$
(25) $CF_3COO(CH_2)_{15}SiCl_3$
(26) $CF_3(CF_2)_5(CH_2)_2SiCl_3$

In addition, although the above Examples 3 and 5 used $CF_3(CF_2)_7(CH_2)_2Si(OCH_3)_3$ as a fluorocarbon water-and-oil-shedding compound, the following compounds shown in the following formulas (31) through (42), inclusive, or a fluoro-organic polyether trialkoxysilane with an average molecular weight of approximately 2000 to 5000, other than those described above, could also be used.

(31) $CF_3CH_2O(CH_2)_{15}Si(OCH_3)_3$
(32) $CF_3(CH_2)_3Si(CH_3)_2(CH_2)_{15}Si(OCH_3)_3$
(33) $CF_3(CF_2)_5(CH_2)_2Si(CH_3)_2(CH_2)_9Si(OCH_3)_3$
(34) $CF_3(CF_2)_7(CH_2)_2Si(CH_3)_2(CH_2)_9Si(OCH_3)_3$
(35) $CF_3COO(CH_2)_{15}Si(OCH_3)_3$
(36) $CF_3(CF_2)_5(CH_2)_2Si(OCH_3)_3$
(37) $CF_3CH_2O(CH_2)_{15}Si(OC_2H_5)_3$
(38) $CF_3(CH_2)_3Si(CH_3)_2(CH_2)_{15}Si(OC_2H_5)_3$
(39) $CF_3(CF_2)_5(CH_2)_2Si(CH_3)_2(CH_2)_9Si(OCH_5)_3$
(40) $CF_3(CF_2)_7(CH_2)_2Si(CH_3)_2(CH_2)_9Si(OC_2H_5)_3$
(41) $CF_3COO(CH_2)_{15}Si(OC_2H_5)_3$
(42) $CF_3(CF_2)_5(CH_2)_2Si(OC_2H_5)_3$

In Examples 1 through 5, inclusive, for the silanol condensation catalyst, groups of carboxylic acid metal salt, carboxylic acid ester metal salt, carboxylic acid metal salt polymer, carboxylic acid metal salt chelate, titanic acid ester, and titanic acid ester chelate are available. More specifically, stannous acetic acid, dibutyltin dilaurate, dibutyltin dioctate, dibutyltin diacetate, dioctyltin dilaurate, dioctyltin dioctate, dioctyltin diacetate, stannous dioctanoic acid, lead naphthenate, cobalt naphthenate, iron 2-ethyl hexanoate, dioctyltin bis-octylthioglycolate ester, dioctyltin maleate ester, dibutyltin maleate polymer, dimethyltin mercaptopropionate polymer, dibutyltin bis-acetylacetate, dioctyltin bis-acetyl laurate, tetrabutyltitanate, tetranonyltitanate, bis(acetylacetonyl) dipropyl titanate, and metal oxide, such as $TiO_2$, could be used.

For the film forming liquid, an anhydrous organochlorine solvent, hydrocarbon solvent, fluorocarbon solvent, silicone solvent, or a mixture of these were available as a solvent in the case that the binding group of the film compound or the water-and-oil-shedding compound is either an alkoxysilane-type or a chlorosilane-type. If trying to increase the particle concentration by evaporating the solvent without cleaning, the boiling point of the solvent should preferably be between 50 and 250 degrees Celsius.

More precisely, if the binding group is a chlorosilane-type, then non-aqueous petroleum naphtha, solvent naphtha, petroleum ether, petroleum benzine, isoparaffin, n-paraffin, decalin, industrial gasoline, nonane, decane, kerosene, dimethyl silicone, phenyl silicone, alkyl modified silicone, polyether silicone, and dimethylformamide can be listed as available solvents.

In addition, if the binding group is an alkoxysilane-type and the coating is formed by evaporating the solvent, an alcohol solvent, such as methanol, ethanol, propanol, or a mixture of these, could be used in addition to the above listed solvents.

In addition, the fluorocarbon solvent can be a chlorofluorocarbon solvent, Fluorinert (a product manufactured by 3M Company [U.S.A.]) and Aflude (a product manufactured by Asahi Glass Co., Ltd.). These may be used solely, or two or more kinds may be mixed if the combination blends well. In addition, an organochlorine solvent, such as chloroform, may be added.

On the other hand, when one or more of the compounds chosen from a ketimine compound, organic acid, aldimine compound, enamine compound, oxazolidine compound, or an aminoalkylalkoxysilane compound were used instead of the above-described silanol condensation catalyst, the processing time was reduced to approximately ½ to ⅔ at the same concentration.

Moreover, when the silanol condensation catalyst is mixed with one or more of the compounds chosen from a ketimine compound, organic acid, aldimine compound, enamine compound, oxazolidine compound, or aminoalkylalkoxysilane compound (although the ratio can vary from 1:9 to 9:1, it is normally preferable to be around 1:1), the processing time can be even several times faster, so that the time for film formation can be reduced to a fraction.

For example, when a dibutyltin oxide, which is a silanol catalyst, was replaced with H3 (from Japan Epoxy Resins Co., Ltd.), a ketimine compound, and the other conditions remained the same, we obtained almost the same results, except that the reaction time was reduced to approximately one hour.

Moreover, when the silanol catalyst was replaced with a mixture of H3 (from Japan Epoxy Resins Co., Ltd.), a ketimine compound, and dibutyltin bis-acetylacetonate, a silanol catalyst (mixing ratio of 1:1), and the other conditions remained the same, we obtained almost the same results, except that the reaction time was reduced to approximately 20 minutes.

Therefore, the above results clearly indicated that the ketimine compound, organic acid, aldimine compound, enamine compound, oxazolidine compound, and aminoalkylalkoxysilane compound are more active than the silanol condensation catalyst.

Moreover, the activity was further enhanced when the silanol condensation catalyst was used with one or more promoters selected from a ketimine compound, organic acid, aldimine compound, enamine compound, oxazolidine compound, or an aminoalkylalkoxysilane compound.

The available ketimine compounds are not particularly limited and include the following examples: 2,5,8-triaza-1,8-nonadien; 3,11-dimethyl-4,7,10-triaza-3,10-tridecadien; 2,10-dimethyl-3,6,9-triaza-2,9-undecadien; 2,4,12,14-tetramethyl-5,8,11-triaza-4,11-pentadecadien; 2,4,15,17-tetramethyl-5,8,11,14-tetraaza-4,14-octadecadien; 2,4,20,22-tetramethyl-5,12,19-triaza-4,19-trieicosadien; etc.

In addition, there are no particular limitations to the organic acids available; however, formic acid, acetic acid, propionic acid, butyric acid, and malonic acid, for example, showed almost the same effect.

In the above five examples, alumina fine particles were used for the explanation; however, any fine particles that contain active hydrogen (i.e., the hydrogen of a hydroxyl group or the hydrogen of an amino group or an imino group) in the surface are available as the fine particles for the present invention.

In more concrete terms, it is obvious that other than alumina, transparent fine particles harder than glass, such as silica and zirconia, are also available.

Example 6

A glass plate with a droplet contact angle of approximately 160 degrees was produced under the same conditions as those of the transparent base material for solar cells produced in Example 1 and was installed in a solar water heater for practical trials. As a result, dust in the air and dirt from rain water hardly stuck to it, and the heat collection efficiency improved by an average of 6% compared to those equipped with normal glass (practically a similar effect was obtained when the droplet contact angle was 150 degrees or more). In addition, the deterioration of the heat collection efficiency over time was also reduced to just several tenths compared to those equipped with normal glass.

The above experimental results indicate that the solar cells and solar water heaters of the present invention have an extremely high durability and high efficiency.

Although the above examples disclose the applications to solar cells and solar water heaters, these examples shall not be construed as limiting of the applications of the present invention. It is obvious that the present invention is also applicable to any equipment (e.g., a glasshouse) that uses the solar energy.

The invention claimed is:

1. A structure comprising a surface of an incident light side of a transparent base material covered by water-and-oil-shedding transparent fine particles that are bound and fixed to the surface of said transparent base material, wherein a part of the surface of said transparent fine particles is bound to a first silane film compound, which has a first functional group at one end and is bound to the surface of said transparent fine particles at the other end; a part of the surface of said transparent base material is bound to a second silane film compound, which has a second functional group at one end and is bound to the surface of said transparent base material at the other end, wherein either said first or second functional group is an epoxy group, and the other is an amino or imino group; and said transparent fine particles are bound and fixed to the surface of said transparent base material by a covalent bond formed by a reaction between said first functional group and said second functional group, and wherein the structure is a solar energy utilization device; and wherein said transparent fine particles cover the surface of said transparent base material with a single layer.

2. The structure of claim 1, wherein said first and second silane film compounds are covalently bound to the respective surface of said transparent fine particles and said transparent base material via a Si bond containing group.

3. The structure of claim 1, wherein one or more of the compounds chosen from said water-and-oil-shedding coating, said first silane film compound, and said second silane film compound form a monomolecular film.

4. The structure of claim 1, wherein said transparent fine particles are bound and fixed to the surface of said transparent base material by sintering.

5. The structure of claim 4, wherein said transparent fine particles cover the surface of said transparent base material with a single layer.

6. The structure of claim 1, wherein said transparent fine particles comprise a substance selected from translucent silica, alumina, or zirconia.

7. The structure of claim 1, wherein the size of said transparent fine particles is 100 nm or less.

8. A method for manufacturing a solar energy utilization device, the method comprising: reacting transparent fine particles with a first silane film compound, the first silane film compound comprising a first functional group at one end and a first binding group forming a bond by a reaction with a surface group of said transparent fine particles at the other end to manufacture reactive transparent fine particles in which said first silane film compound is bound to the surface via said first binding group; reacting a transparent base material of the solar energy utilization device with a second silane film compound comprising a second functional group forming a covalent bond by a reaction with said first functional group at one end and a second binding group forming a bond by a reaction with the surface group of said transparent base material at the other end of manufacture a reactive transparent base material in which said second silane film compound is bound to the surface via said second binding group: contacting said reactive transparent fine particles with said reactive transparent base material to react said first functional group with said second functional group in order to form a covalent bond to bind and fix said reactive transparent fine particles to the surface of said transparent base material; and reacting the transparent fine particles bound and fixed to the surface of said transparent base material with a water-and-oil-shedding compound comprising a third binding group covalently bound to the surface of said transparent fine particles by a reaction at the one end to form water-and-oil-shedding coating on the surface of said transparent fine particles; wherein either said first or second functional group is an epoxy group, and the other is an amino or imino group; and wherein either the first or second functional group is an epoxy group and the other is an amino or imino group, and said transparent fine particles cover the surface of said transparent base material with a single layer.

9. The method of claim 8, wherein said third binding group is trichlorosilane, and said reaction between said water-and-oil-shedding compound and said transparent fine particles under the presence of a silanol condensation catalyst.

10. The method of claim 9, wherein at least one promoter chosen from a ketimine compound, organic acid, aldimine compound, enamine compound, oxazolidine compound, or an aminoalkylalkoxysilane compound is used with said silanol condensation catalyst.

11. The method of claim 8, wherein said transparent base material is glass and the method further comprising sintering the transparent base material, to which said transparent fine particles are bound and fixed, in an atmosphere containing oxygen wherein organic matters are then thoroughly removed so that said transparent fine particles are directly fixed to said transparent base material.

12. The method of claim 11, wherein the temperature of said sintering is equal to or higher than 400 degrees Celsius and lower than the melting temperature of said transparent base material and said transparent fine particles.

13. The structure of claim 1, further comprising a water-and-oil-shedding compound comprising a third binding group covalently bound to the surface of the transparent fine particles.

14. The structure of claim 13, wherein the third binding group comprises trichlorosilane.

15. The structure of claim 1, wherein the transparent base material is sintered glass.

16. The structure of claim 1, wherein the transparent base material is glass.

* * * * *